United States Patent
Kapoor et al.

(10) Patent No.: US 7,152,216 B2
(45) Date of Patent: Dec. 19, 2006

(54) METHOD, SYSTEM, AND COMPUTER PROGRAM PRODUCT FOR AUTOMATIC INSERTION AND CORRECTNESS VERIFICATION OF LEVEL SHIFTERS IN INTEGRATED CIRCUITS WITH MULTIPLE VOLTAGE DOMAINS

(75) Inventors: Bhanu Kapoor, Richardson, TX (US); Debabrata Bagchi, Noida (IN)

(73) Assignee: Atrenta, Inc., San Jose, CA (US)

( * ) Notice: Subject to any disclaimer, the term of this patent is extended or adjusted under 35 U.S.C. 154(b) by 173 days.

(21) Appl. No.: 10/711,971

(22) Filed: Oct. 15, 2004

(65) Prior Publication Data

US 2006/0085770 A1   Apr. 20, 2006

(51) Int. Cl.
*G06F 17/50* (2006.01)
(52) U.S. Cl. .............................. 716/4; 716/18
(58) Field of Classification Search ............. 716/1, 716/4, 18
See application file for complete search history.

(56) References Cited

U.S. PATENT DOCUMENTS

| 6,083,271 | A | 7/2000 | Morgan |
| 6,351,173 | B1 | 2/2002 | Ovens |
| 6,614,283 | B1 | 9/2003 | Wright |
| 6,668,356 | B1 * | 12/2003 | Linz ............................. 716/1 |

* cited by examiner

*Primary Examiner*—Thuan Do
(74) *Attorney, Agent, or Firm*—Sughrue Mion, PLLC

(57) ABSTRACT

Level shifter modules, used in integrated circuits (ICs), are automatically inserter and their correctness verified. A level shifter module for signals crossing voltage domains is generated, and instances thereof are inserted in a predetermined voltage domain. Several checks ensure the correctness of the inserted level shifter module. The level shifter modules are instantiated based on user-defined voltage constraints.

36 Claims, 10 Drawing Sheets

```
module top(in1, in2, out1);

input in1;
    output out1;
    input in2;

wire in_recv;
    wire out_recv;
    wire enableSig;

assign in_recv = ~in1;
    process prs0(out_recv, out_recv0);
    rec_mod prs1(out_recv0, in2, out1);

endmodule module rec_mod(in1, in2, out);
    input in1;
    input in2;
    output out;

rec_process rec_prs0(in1, in2, out);

endmodule module process(in, out);
    input in;
    output out;

turing t0(in, out);
```

FIGURE 4B

```
4000   current_design top
4010   voltagedomain -name VDDTop -value 1.2 -modname top+
4020   Voltagedomain -name VDDCritical0 -value 1.5 -instname top.prs0+
4030   voltagedomain -name VDDCritical1 -value 1.7 -instname top.prs1+
4040   levelshifter -name LS_2X1_12TO15 -from VDDTop -to VDDCritical0 -at
VDDTop -      enableTerm EN -inTerm A -outTerm Z -enableNet enableSig
4050   levelshifter -name LS_2X1_12TO17 -from VDDTop -to VDDCritical1 -at
VDDTop -      enableTerm EN -inTerm A -outTerm Z -enableNet enableSig
4060   levelshifter -name LS_2X1_15TO12 -from VDDCritical0 -to VDDTop -at
VDDTop -      enableTerm EN -inTerm A -outTerm Z -enableNet enableSig
4070   levelshifter -name LS_2X1_17TO12 -from VDDCritical1 -to VDDTop -at
       VDDTop -enableTerm EN -inTerm A -outTerm Z -enableNet enableSig
4080   levelshifter -name LS_2X1_15TO17 -from VDDCritical0 -to VDDCritical1 -at
       VDDTop -enableTerm EN -inTerm A -outTerm Z -enableNet enableSig
```

FIGURE 4C

```
4100   module top(in1, in2, out1);

4110      input in1;
4120      output out1;
4130      input in2;

4140      wire in_recv;
4150      wire out_recv;
4160      wire enableSig;

4170      assign in_recv = ~in1;
4180      LS_2X1_12TO15 ls0(.A(in_recv), .EN(enableSig), .Z(ls0_in_recv));
4190      process prs0(ls0_in_recv, out_recv0);
4200      LS_2X1_15TO17 ls1(.A(out_recv0), .EN(enableSig), .Z(ls1_out_recv0));
4210      LS_2X1_12TO17 ls2(.A(in2), .EN(enableSig), .Z(ls2_in2));
4220      rec_mod  prs1(ls1_out_recv0, ls2_in2, ls3_out1);
4230      LS_2X1_17TO12 ls3(.A(ls3_out1), .EN(EnableSig), .Z(out1));

4240   endmodule 4250   module rec_mod(in1, in2, out);
4260       input in1;
4270       input in2;
4280       output out;

4290   rec_process rec_prs0(in1, in2, out);

4300   endmodule 4310   module process(in, out);
4320       input in;
4330       output out;

4340       turing t0(in, out);

4350   endmodule
```

FIGURE 4D

METHOD, SYSTEM, AND COMPUTER PROGRAM PRODUCT FOR AUTOMATIC INSERTION AND CORRECTNESS VERIFICATION OF LEVEL SHIFTERS IN INTEGRATED CIRCUITS WITH MULTIPLE VOLTAGE DOMAINS

TECHNICAL FIELD

The present invention relates generally to the design of integrated circuits (ICs) and more particularly to a system, method, and computer program product for the insertion of level shifters and verification thereof as part of the design process of ICs.

BACKGROUND OF THE INVENTION

In recent years, the complexity of integrated circuits (ICs) has dramatically increased in both size and number of transistors, resulting in higher power consumption. A typical IC may have a wide range of power supply conditions, a number of independent voltage domains, and circuit performance objectives. Generally, different voltage domains are established depending upon performance needs for various functional blocks of an IC.

To reduce the power consumption, a typical IC includes multiple voltage domains, each domain being capable of operating in a different internal voltage level. In such an IC only the most performance critical portions of the design operate at a higher voltage. Hence, an IC having a first voltage domain powered by the $V_{DD}$ may have a second voltage domain operating at a certain fraction, for example 60%, of $V_{DD}$. The first voltage domain may activate a first portion of the design, for example, 25% of the design, and the second portion of the design, covering for example 75%, of the design, may be activated by the second voltage domain. This simple design of two voltage domains significantly reduces the power consumption, because each portion of the design receives the power that it needs for its proper operation, rather than having the entire IC operating at $V_{DD}$. The dynamic power consumption in digital circuits is proportional to the square of the operating voltage of the circuit. A person skilled in the art would note that the use of two power domains is merely an example, and that three or more power domains are possible too.

When an IC design includes multiple voltage domains, a level shifter is used to shift the voltage level of an output signal from a first voltage domain to the voltage level of a second voltage domain. A level shifter may transit the output signals from the lower level voltage to the higher level voltage and vice versa. A level shifter generally includes switching elements, such as transistors, that control the switching of the output signal between logical zero '0' and logical one '1' values.

Referring to FIG. 1 a schematic diagram of a typical prior art IC 100, including three voltage domains operating in different voltage levels, is shown. Voltage domain 110 operates at 0.7 volts (V), voltage domain 120 operates at 0.8V, and voltage domain 130 operates at 1V. An output signal 101 of voltage domain 110 is a 0.7V clock signal that is received at level shifters 140 and 150. Level shifter 140 shifts up the voltage level of signal 101 to a 0.8V of signal 102, and level shifter 150 shifts up the voltage level of signal 101 to a 1V signal 103. Signals 102 and 103 are now input signals of voltage domains 120 and 130 respectively. Output signal 104, having a 0.8V level of voltage domain 120, is shifted down by means of level shifter 160, to a 0.7V level of signal 106. Similarly, output signal 105 of voltage domain 130 is shifted down, by means of level shifter 170, from the 1V level of signal 105 to a 0.7V level of signal 107. Signals 106 and 107 are now input signals of voltage domain 110.

Process technologies now allow for creation of multiple voltage domains in IC designs. Even though the abstract idea of having voltage domains is a relatively simple one, there are significant challenges involved with the design of an IC that includes multiple voltage domains. One such challenge is to ensure a level conversion of the signals that cross voltage domain boundaries. When partitioning the design into multiple voltage domains, it is necessary to place appropriate level shifters for signals crossing unmatched voltage domains. That is, the designer has to identify all signals crossing unmatched voltage domains existing in the design. Each and every one of those signals has to be connected to an appropriate respective level shifter. In ICs where the number of voltage domains may be large, or where the number of signals crossing voltage domains is large, this is an inefficient, time-consuming, as well as error prone task. Furthermore, prior art design tools (e.g., computer aided design (CAD) tools), do not provide any automated means for checking the correctness of level shifters placed in the design. Moreover, such tools generally do not provide an automated method that inserts level shifters and appropriately places them in the IC design.

SUMMARY OF THE INVENTION

It would be, therefore, advantageous to provide a solution that automatically inserts level shifter modules to be placed between signals crossing voltage domains. It would be further advantageous if the provided solution automatically detects level shifter modules within the design and checks their correctness.

The invention is taught below by way of various specific exemplary embodiments explained in detail, and illustrated in the enclosed drawing figures.

BRIEF DESCRIPTION OF THE DRAWINGS

The drawing figures depict, in highly simplified schematic form, embodiments reflecting the principles of the invention. Many items and details that will be readily understood by one familiar with this field have been omitted so as to avoid obscuring the invention. In the drawings:

FIGS. 4A, 4B, 4C, 4D, and 4E are non-limiting examples illustrating exemplary operations according to the present invention;

DETAILED DESCRIPTION OF THE PREFERRED EMBODIMENTS

Figure 1:
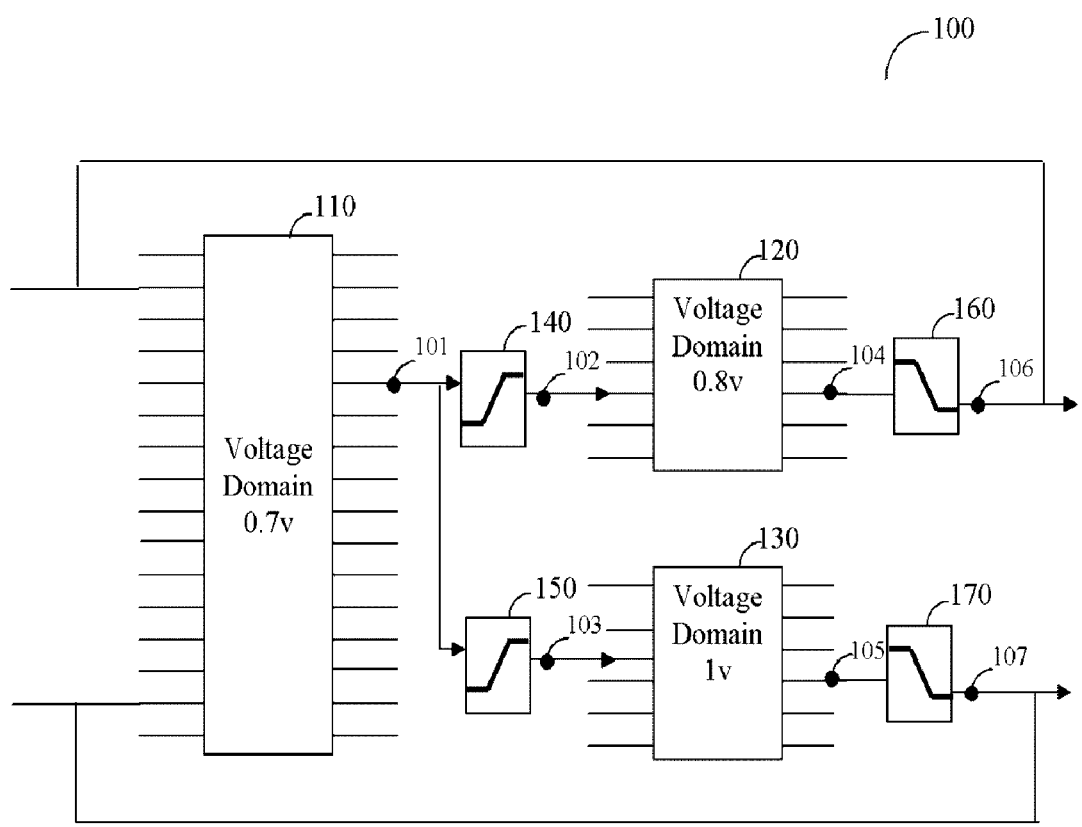
FIG. 1 is an exemplary circuit including three voltage domains connected to level shifters (prior art)

The invention will now be taught using various exemplary embodiments. Although the embodiments are described in detail, it will be appreciated that the invention is not limited to just these embodiments, but has a scope that is significantly broader. The appended claims should be consulted to determine the true scope of the invention. Prior to describing the embodiments in detail, however, the meaning of certain terms will be explained.

Computer Systems

One embodiment of this invention resides in a computer system. Here, the term "computer system" is to be understood to include at least a memory and a processor. In general, the memory will store, at one time or another, at least portions of an executable program code, and the processor will execute one or more of the instructions included in that executable program code. It will be appreciated that the terms "executable program code," "software," and "instructions" mean substantially the same thing for the purposes of this description. It is not necessary to the practice of this invention that the memory and the processor be physically located in the same place. That is to say, it is foreseen that the processor and the memory might be in different physical pieces of equipment or even in geographically distinct locations.

Computer Program Products

The above-identified invention may be embodied in a computer program product, as will now be explained.

On a practical level the software, that enables the computer system to perform the operations described in detail further below, may be supplied on any of a variety of media. Furthermore, the actual implementation of the approach and operations of the invention may actually be statements in a computer language. Such computer language statements, when executed by a computer, cause the computer to act in accordance with the particular content of the statements. Furthermore, the software that enables a computer system to act in accordance with the invention may be provided in any number of forms including, but not limited to, original source code, assembly code, object code, machine language, compressed or encrypted versions of the foregoing, and any and all equivalents now known or hereafter developed.

One familiar with this field will appreciate that "media", or "computer-readable media", as used here, may include a diskette, a tape, a compact disc, an integrated circuit, a ROM, a CD/DVD, a cartridge, a memory stick or card, a remote transmission via a communications circuit, or any other medium useable by computers, including those now known or hereafter developed. For example, to supply software for enabling a computer system to operate in accordance with the invention, the supplier might provide a disc or might transmit the software in some form via satellite transmission, via a direct wired or a wireless link, or via the Internet. Thus, the term, "computer readable medium" is intended to include all of the foregoing and any other medium by which software may be provided to a processor.

Although the enabling software/code/instructions might be "written on" a disc, "embodied in" an integrated circuit, or "carried over" a communications circuit, it will be appreciated that, for the purposes of this discussion, the software will be referred to simply as being "on" the computer readable medium. Thus, the term "on" is intended to encompass the above mentioned and all equivalent and possible ways in which software can be associated with a computer readable medium.

For the sake of simplicity, therefore, the term "program product" is thus used to refer to a computer readable medium, as defined above, which has on it any form of software to enable a computer system to operate according to any embodiment of the invention.

Having explained the meaning of various terms, the invention will now be described in detail, in the context of a method.

Now, there is described a method for the automatic insertion of level shifter modules used in integrated circuits (ICs) and the correctness verification thereof. A level shifter module for signals crossing voltage domains is generated, and instances thereof are inserted in a pre-determined voltage domain. Thereafter, there are performed several checks to ensure the correctness of the inserted level shifter module. The level shifter modules are inserted based on user-defined voltage constraints.

Figure 2:
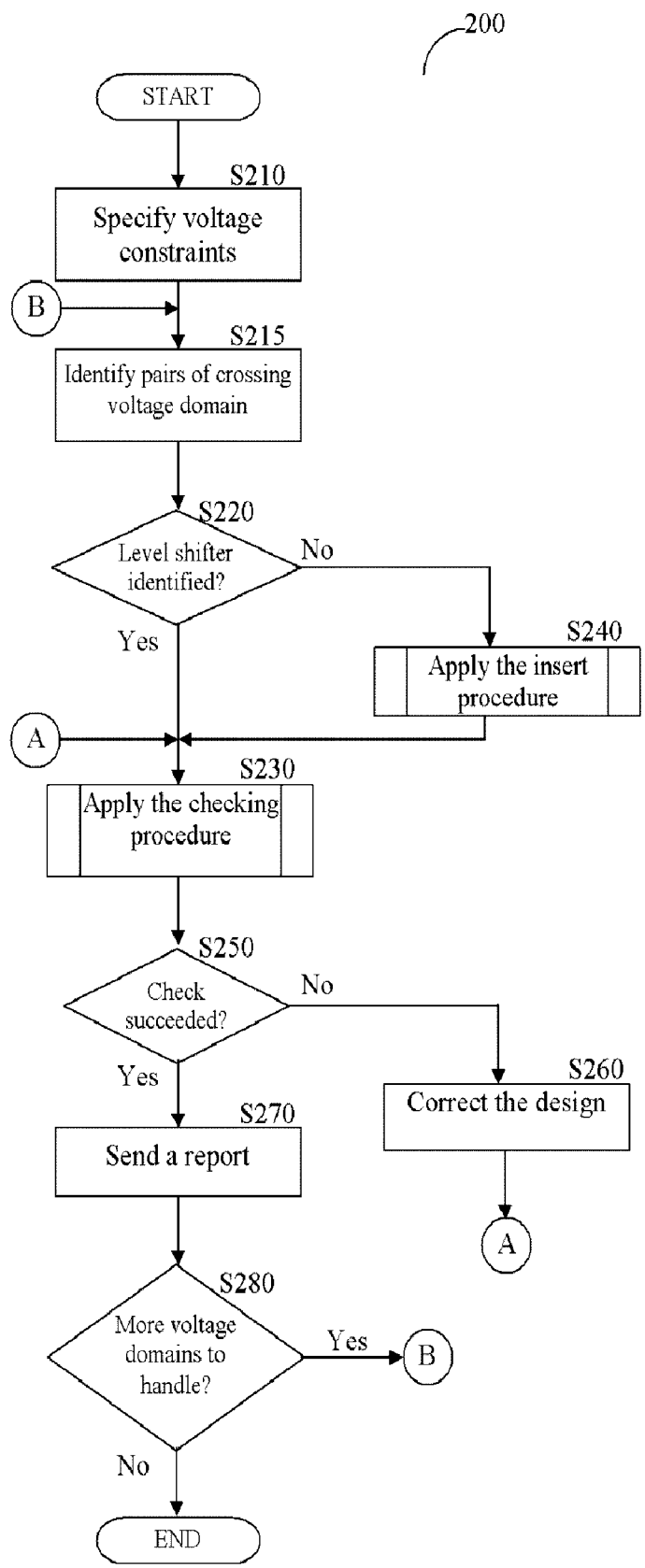
FIG. 2 is a non-limiting flowchart describing operations in accordance with an embodiment of the present invention.

FIG. 2 shows an exemplary and non-limiting flowchart 200. Various constraints (hereinafter the "voltage constraints") are specified by a user (e.g., a design engineer) at step S210, primarily for the purpose of verifying that level shifters correctly shift the voltage levels of signals crossing voltage domains. The voltage constraints include at least a list of voltage domains in the design, and for each voltage domain its respective working voltage level (value). For example, the voltage constraints can be defined as follows:

(1). voltagedomain-instname "top.wkup_domain_inst+" "top.ctrl domain_inst+"-name WPD-values 1.0

(2). voltagedomain-instname "top.megamodule1+"-name WPD-values 0.8

The "-instname" field defines a module in the design acting as a voltage domain, the "-name" field defines the voltage domain for the module and the "-value" determines the working voltage level of that voltage domain. Each voltage domain, or a group of domains, operates in a different level specified through a separate constraint. For example, the constraint defined in (1) specifies two modules in the design "top.wkup_domain_inst" and "top.ctrl_domain_inst" of a 1.0V voltage domain. The constraint defined in (2) specifies a module "top.megamodule1" of a 0.8V voltage domain.

At step S215, a pair of voltage domains, each having a different working voltage level, is identified. A different pair of voltage domains is selected each time execution reaches this step to ensure that all possible pairs of voltage domains specified in the voltage constraints are tested. For example, in the first round of execution the pair "top.wkup_domain_inst" and "top.megamodule1" is identified, while in the second round of execution the pair "top.ctrl_domain_inst+" and "top.megamodule1" is identified.

At step S220, it is determined, for each signal crossing a pair of voltage domains, whether a level shifter module shifting the crossing signal exists in the design; if so, execution continues with S230, where the correctness of this level shifter is checked; otherwise, execution continues with step S240, where a procedure for generating and inserting a level shifter module is applied. Specifically, the procedure of step S240 instantiates code for a logic module, defining the level shifter to be placed between a signal crossing the source and the destination voltage domains, and inserts this module in the specified voltage domain. It should be noted that, if more than one signal crossing the pair of domains selected at S220 is found, then all of these signals are connected to the generated level shifter module. The description language may be, but is not limited to, Verilog, VHDL, or a combination thereof. The procedure for generating and inserting a level shifter module is described in greater detail below. Once the level shifter is inserted in the design (S240), execution continues with step S230 by checking the correctness of the new design including the inserted level shifters. Step S230 is executed by a checking procedure described in further detail below. At step S250, it is determined if the check succeeded, and if so at step S270 a success report, that includes the check results, is provided to the user; otherwise, execution continues with step S260, where an attempt is made to correct the created level shifter module. Specifically, the register transfer level (RTL) statements are analyzed to resolve the design error or errors detected by the checking procedure. For example, if the check discovers that one of the level shifter cells forming the level shifter is not connected to a common enabling signal, then the design is fixed by connecting that logic cell to the common enabling signal. A level shifter cell that includes an enable signal is a special type of isolation logic and a level shifter cell, integrated into a single logic cell. The generation and checking of isolation logic is disclosed in the US patent application entitled "A Method, System, and Computer Program Product for Generating and Verifying Isolation Logic Modules in Design of Integrated Circuits" assigned to a common assignee and hereby incorporated by reference for all that it contains on the topic of the generation and checking of isolation logic. The execution then continues with step S230. At step S280, another check is performed to determine if all voltage domains specified in the voltage constraints were handled, and if so execution ends; otherwise, execution continues with step S215.

Figure 3:
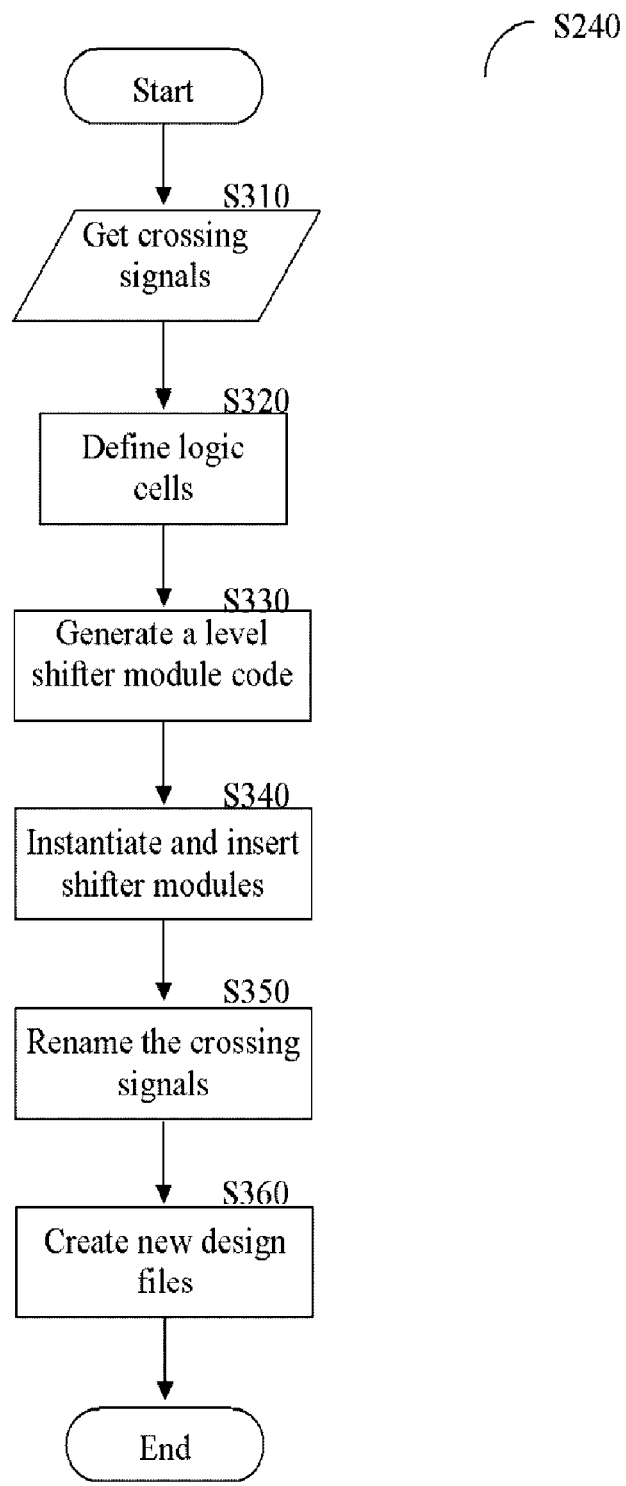
FIG. 3 is a non-limiting flowchart describing in detail the procedure for inserting level shifter modules in accordance with an exemplary embodiment of the present invention.

Referring to FIG. 3, a non-limiting flowchart S240 describing the procedure for generating and inserting level shifter modules in accordance with an exemplary embodiment of the present invention is shown. Each time this procedure is called a single level shifter module may be generated and inserted in the design. At step S310, a crossing signal that does not include a level shifter is received. For each such signal the source domain, i.e., the origin domain of the crossing signal and the destination domain of the crossing signal are determined. At step S320, to support the specification of level shifters for both RTL and gate level netlists, the user may define the level shifter cells that form the level shifter module. For each level shifter cell, the user may configure the cell name, the source voltage domain (i.e., the cell's input voltage domain), the cell's output voltage domain, voltage domain where the cell can be placed at, as well as the input and the output terminals of the level shifter cell. If a level shifter cell is integrated with isolation logic then the enable terminal and the enable signal of the isolation logic also may be configured. For example, a level shifter cell may be defined using the constraint:

(3). levelshifter-name LS_RX01V12V-from WPD1-to WPD12-at WPD1-inTerm A-outTerm Z-enable Term EN-enableNet insig In the constraint defined in (3) the source and destination voltage domains are WPD1 and WPD12 respectively. The level shifter cell name is defined as "LS_RX01V12V", the field "-at" defines the voltage domain in which the level shifter is instantiated, the "-inTerm" and "-outTerm" fields specify, respectively, the signal input and the signal output terminals of the level shifter cell, and the enable terminal name of the level shifter is provided using the field "-enableTerm". The enable terminal is the input of the enabling signal and it is part of the cell definition. At step S330, based on the constraints defined by the user a level shifter module to be placed within the crossing signals is generated. Specifically, a description language code of a logic module implementing the level shifter for one or more signals crossing the source and destination voltage domains is produced. This code comprises instructions assuring that the voltage domain is correctly shifted from the source voltage domain to the destination voltage domain. For a group of signals fed into the same destination domain, a single shift level module is generated, and instances thereof are used for each of the crossing signals. An exemplary Verilog code module defining a level shifter module is shown in the figures and described below. At step S340, the module generated at step S330 is instantiated and inserted into the source voltage domain. The method correctly instantiates and inserts the level shifter modules in the specified voltage domain using back referencing analysis and synthesized netlist techniques, which generally includes logical gates such as AND, NAND, NOR, OR, XOR, XNOR, latches, and the like.

The back referencing analysis provides the precise location of voltage domain instances in the design. In addition, the back referencing analysis connects a synthesized netlist object model with a data model of the netlist. For every definition and use of a signal in the netlist object model, a way of cross probing is established and the line and file name of every such definition is stored. The cross probing establishes the connection between the source code and the netlist object model of the design. This netlist object model is used to create the schematic for a given design. The cross probing is established by storing the line and the file name of every definition and the use of an object in the netlist object model. The same operation is also performed for each definition and instantiation module. Thus, given a definition of use of a signal in the netlist object model, the precise location of this signal in the design file can immediately be established. Similarly, given an instantiation of a module in the synthesized object model, a corresponding location in the data model is retrieved. The synthesized netlist (or gate level netlist) may be produced by an IC synthesis tool that creates a gate level netlist based on the RTL statements. One such synthesis tool is disclosed in a US patent application entitled "An Apparatus and Method for Handling of Multi-Level Circuit Design Data", Ser. No. 10/118,242, assigned to common assignee and is hereby incorporated for all that it contains.

At step S350, the output name of the crossing signal, i.e., the output of the source voltage domain is renamed and the original name is retained as output name of the inserted level shifter module. This is performed to restrict the locality of changes, i.e., to ensure that the interfaces of the level shifters stay the same as the original's output names of the source voltage domain. At step S360, new design files including the new level shifters are generated and displayed to the user. The design file may include a new RTL description and the synthesized netlist.

FIGS. 4A–4E show a non-limiting example for generating and inserting a level shifter module in accordance with the present invention. In this example, a level shifter module, composed of four level shifter cells, used to shift the voltage level between three different modules of a central procession unit (CPU) IC is generated. The design of CPU IC 400, shown in FIG. 4A, includes the following modules: a TOP module 410, a PRS0 module 420, and a PRS1 module 430, each of which operates at a different voltage level. Specifically, the voltage levels of modules TOP 410, PRS0 420, and PRS1 430 are 1.2V, 1.5V, and 1.7V respectively. The Verilog code defining the design of CPU IC 400 is provided in FIG. 4B. In order to enable the creation of a level shifter module to be placed in the design of CPU IC 400 the user has to specify the voltage constraints. An example for such constraints is provided in FIG. 4C. The voltage constraints include, in lines 4010, 4020, and 4030 a list of voltage domains in the design of the CPU IC 400, and for each voltage domain its respective working voltage level is specified. Furthermore, as can be seen in lines 4040 through 4080, five level shifter cells to be used in the generation of the level shifter module are defined. The first cell "LS_2X1_12TO15" shifts up the voltage level from 1.2V to 1.5V. The second cell "LS_2X1_12TO17" shifts up the voltage level from 1.2V to 1.7V. The third cell "LS_2X1_15TO12" shifts down the voltage level from 1.5V to 1.2V. The fourth cell "LS_2X1_17TO12" shifts down the voltage level from 1.7V to 1.2V. The fifth cell "LS_2X1_15TO17" shifts up the voltage level from 1.5V to 1.7V. For all these level shifter cells the input and output terminals are defined using the variables "A" and "Z" respectively. In addition, a single instance of each of these cells will be placed at the TOP module 410.

Once the voltage constraints are specified by the user, the VHDL or Verilog code for the level shifter module is created and inserted in the design of CPU IC module 400. An exemplary Verilog code of the generated level shifter is provided in FIG. 4D. The exemplary code includes, in lines 4180, 4200, 4210 and 4230, the statements for creating instances of the level shifter cells defined in the voltage constraints. Specifically, the statement in line 4180 creates an instance "Is0" of the "LS_2X1_12TO15" cell with the "in_recv" signal connected to its input terminal and the "Is0_in_recv" signal as its output terminal. The statement in line 4200 creates an instance "Is1" of the "LS_2X1_15TO17" cell with the "out_recv0" signal connected to its input terminal and the "Is1_out_recv0" signal as its output terminal. The statement in line 4210 creates an instance "Is2" of the "LS_2X1_12TO17" cell with the "in2" signal connected to its input terminal and the "Is2_in2" signal as its output terminal. The statement in line 4230 creates an instance "Is3" of the "LS_2X1_17TO12" cell with the "Is3_out1" signal connected to its input terminal and the "out1" signal as its output terminal. Furthermore, the generated code includes some modified statements in lines 4190 and 4220 to enable the appropriate connections between the level shifter cells and the various modules of CPU IC 400.

Figure 4A:
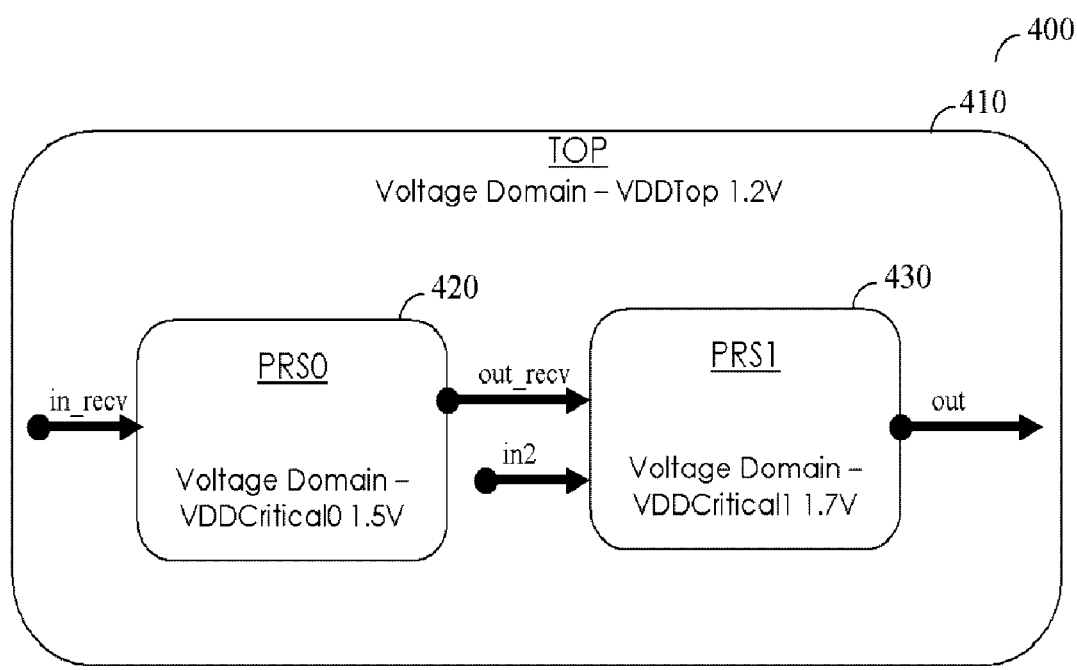
Figure 4E:
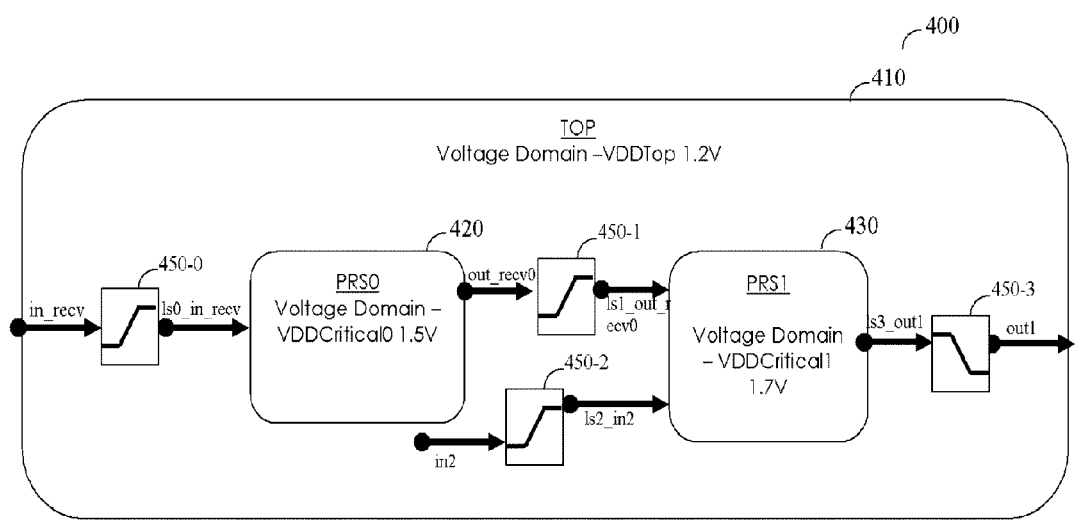

Thereafter, the Verilog level shifter module is instantiated in the voltage domain specified in the voltage constraints. FIG. 4E shows the new design of the CPU IC module 400 including the generated level shifter module. Level shifter module 440 includes four level shifter cells 450-0, 450-1, 450-2 and 450-3 corresponding to the instances "Is0", "Is1", "Is2" and "Is3" defined in the Verilog code and described above.

Figure 5:
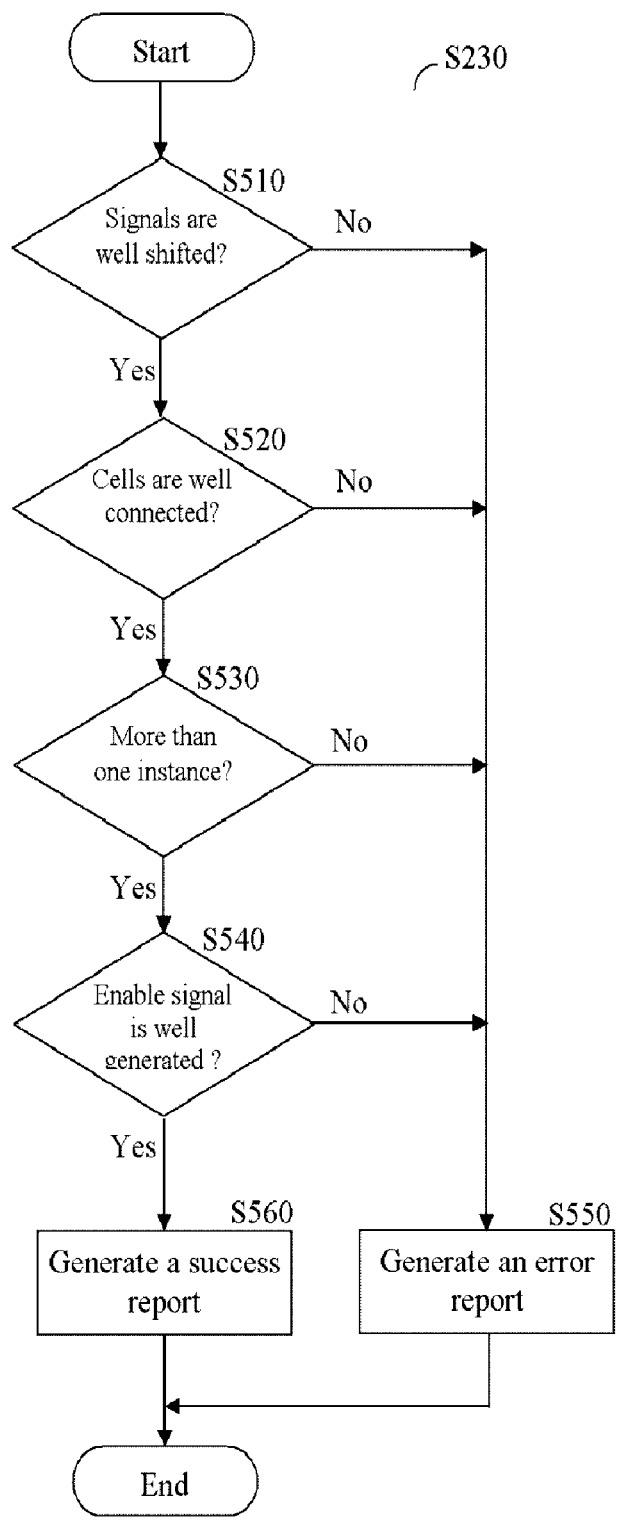
FIG. 5 is a non-limiting flowchart describing the procedure for checking the correctness level shifter modules in accordance with an exemplary embodiment of the present invention.

Referring to FIG. 5, a non-limiting flowchart S230 describing the checking procedure in accordance with an exemplary embodiment of this invention is shown. This method can be used to verify the correctness of the level shifter modules rendered by the insertion procedure or level shifter modules that already exists in the design. At step S510, a check is performed to determine if the level shifter correctly shifts the voltage level when crossing from a source voltage domain to a destination voltage domain. Specifically, it is checked, for each crossing signal, if the level shifter outputs a voltage value compatible with the voltage level of the destination domain. If the check results in an error, execution continues with step S550; otherwise, execution continues with step S520. At step S520 another check is performed to determine if each of the logic cells forming the level shifter is connected to a common enabling signal, and if so execution continues with step S530. If one of the checks made at steps S520 results in an error, execution continues with S550. At step S530, a check is performed to determine if more than one instance of the same level shifter module are found in the design. This check ensures that multiple crossing signals of a source domain that feed into same destination domain are connected a single level shifter module. At step S540 it is checked whether the enable signal is in the higher of the input and output voltage domains and is generated in a specified voltage domain, i.e., an "always on domain". If one of the checks made at steps S530 or S540 results in an error, execution continues with S550, where an error report including the error type is generated and provided to the user. Otherwise, execution continues at step S560, where a success report, including the test results, is generated and provided to the user.

The methods disclosed herein can be further embodied by a person familiar with this field of technology, as part of a computer software program, a computer aided design (CAD) system, a netlist voltage analysis tool, a RTL voltage analysis analysis tool, a CAD program, and the like.

Figure 6:
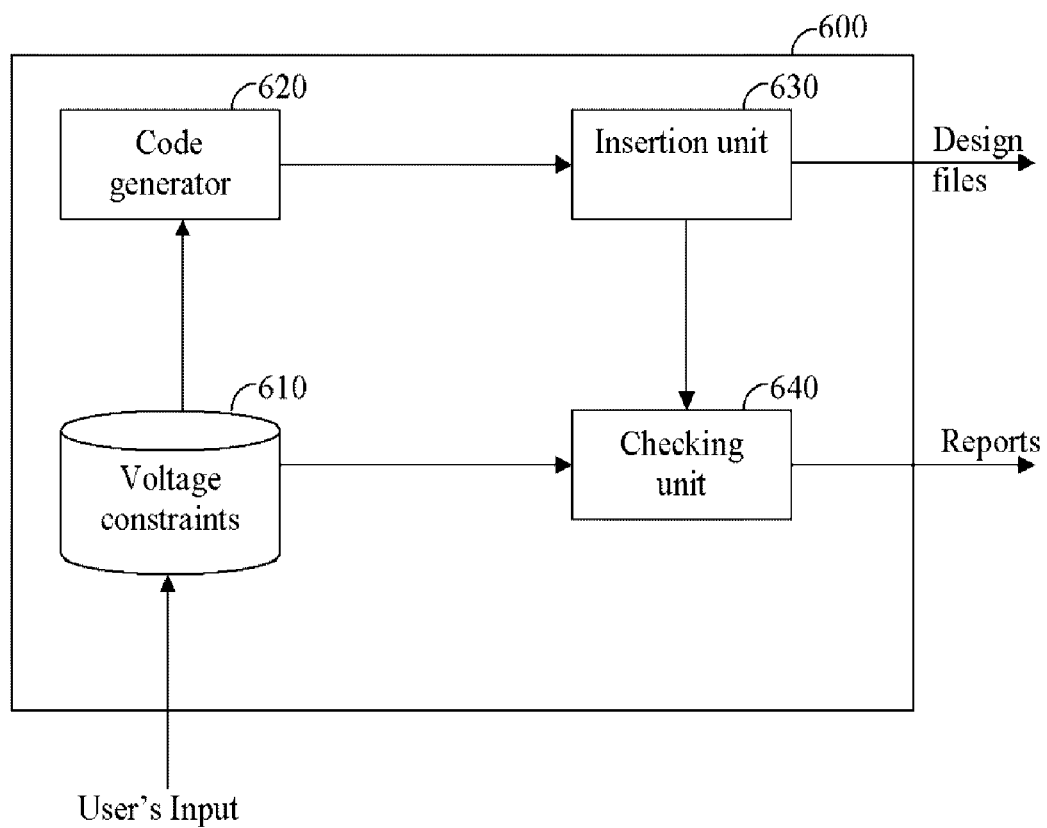
FIG. 6 is an exemplary implementation of a system for verifying voltage domains in the design of an IC.

Referring to FIG. 6 an exemplary implementation of a system 600 for generating and verifying level shifter modules in the design of ICs is shown. A database 610 maintains the voltage constraints specified by the user. A code generator 620 generates a description language code (e.g., VHDL, Verilog, or combination thereof) of level shifter modules. An insertion unit 630 instantiates and inserts the level shifter modules in the specified voltage domains. The insertion unit 630 further outputs the updated design files. A checking unit 640 checks the correctness of the generated level shifter modules, in accordance with the constraints, and sends reports including the check results to the user. The level shifter module to be tested is received from insertion unit 630.

Many variations to the above-identified embodiments are possible without departing from the scope and spirit of the invention. The claims themselves should be consulted to appreciate the full breadth of the invention.

What is claimed is:

1. A method for automatic insertion and correctness verification of level shifters in a design of an integrated circuit (IC), wherein the IC comprises multiple voltage domains, the method comprising:
   specifying a plurality of voltage constraints, defining at least one pair of voltage domains in the design and at least one level shifter cell;
   for each pair of voltage domains, checking whether a signal crossing the voltage domains is connected to a level shifter;
   verifying the correctness in the design of an existing level shifter;
   generating a level shifter module for the crossing signal, when the crossing signal is not correctly shifted; and
   inserting the generated level shifter module in the design.

2. The method of claim 1, wherein the voltage constraints for each voltage domain include at least a working voltage level of the voltage domain.

3. The method of claim 2, wherein the voltage constraints for each level shifter cell include: a source voltage domain, a destination voltage domain, an input terminal, an output terminal, an enable terminal, and a voltage domain to insert the level shifter cell.

4. The method of claim 3, wherein the level shifter cell is part of the generated level shifter module.

5. The method of claim 1, wherein the level shifter module is in at least one of: a register transfer level (RTL) description and a netlist description.

6. The method of claim 1, wherein the design is at least one of a register transfer level (RTL) description and a netlist description.

7. The method of claim 1, wherein the voltage constraints are specified via a graphical user interface (GUI).

8. The method of claim 1, wherein the verifying of the correctness of the level shifter module comprises:
checking whether the voltage level of the crossing signal is shifted to a working voltage level of a destination voltage domain;
generating an error report when at least one level shifter cell in the level shifter module is not connected to a common enabling signal;
generating an error report when the common enabling signal of the level shifter cell is not connected to an always-on voltage domain; and
generating an error report when not more than one instance of the level shifter module is found in the design.

9. The method of claim 8, wherein the error report comprises an error type and a cause of the error.

10. The method of claim 8, wherein the error report is provided to the user.

11. The method of claim 1, wherein the generating of the level shifter module comprises producing a description language code implementing the level shifter module.

12. The method of claim 11, wherein the description language comprises at least one of: Verilog, VHDL, and a combination of Verilog and VHDL.

13. The method of claim 12, wherein the description language code comprises instructions assuring that the voltage level of the crossing signal is appropriately shifted.

14. The method of claim 11, wherein the inserting of the level shifter module comprises:
instantiating the description language code to form an instance of the level shifter module;
inserting the instance of the level shifter module in a voltage domain specified in the voltage constraints; and
renaming output names of the voltage domain.

15. The method of claim 14, wherein the insertion of the level shifter is performed using back referencing analysis and a synthesized netlist.

16. The method of claim 15, wherein the synthesized netlist is created using a synthesis engine.

17. The method of claim 1, wherein the inserting of the level shifter module is preceded by verifying the correctness of the level shifter module placed in the design.

18. The method of claim 1, implemented at least in part by one of a computer aided design (CAD) system, a CAD program, a netlist voltage domain analysis tool, and a register transfer level (RTL) voltage domain analysis tool.

19. A computer program product for enabling a computer to implement operations for automatic insertion and correctness verification of level shifters in a design of an integrated circuit (IC), wherein the IC comprises multiple voltage domains, the computer program product comprising a computer readable medium and instructions on the computer readable medium, the operations comprising:
specifying a plurality of voltage constraints, defining at least one pair of voltage domains in the design and at least one level shifter cell;
for each pair of voltage domains, checking whether a signal crossing the voltage domains is connected to a level shifter;
verifying the correctness in the design of an existing level shifter;
generating a level shifter module for the crossing signal, when the crossing signal is not correctly shifted; and
inserting the generated level shifter module in the design.

20. The computer program product of claim 19, wherein the voltage constraints for each voltage domain include at least a working voltage level of the voltage domain.

21. The computer program product of claim 20, wherein the voltage constraints for each level shifter cell include: a source voltage domain, a destination voltage domain, an input terminal, an output terminal, an enable terminal, and a voltage domain to insert the level shifter cell.

22. The computer program product of claim 21, wherein the level shifter cell is part of the generated level shifter module.

23. The computer program product of claim 19, wherein the level shifter module is in at least one of: a register transfer level (RTL) description and a netlist description.

24. The computer program product of claim 19, wherein the design is at least one of a register transfer level (RTL) description and a netlist description.

25. The computer program product of claim 19, wherein the voltage constraints are specified via a graphical user interface (GUI).

26. The computer program product of claim 19, wherein the verifying of the correctness of the level shifter module comprises:
checking whether the voltage level of the crossing signal is shifted to a working voltage level of a destination voltage domain;
generating an error report when at least one level shifter cell in the level shifter module is not connected to a common enabling signal;
generating an error report when the common enabling signal of the level shifter cell is not connected to an always-on voltage domain; and
generating an error report when not more than one instance of the level shifter module is found in the design.

27. The computer program product of claim 26, wherein the error report comprises an error type and a cause of the error.

28. The computer program product of claim 26, wherein the error report is provided to the user.

29. The computer program product of claim 19, wherein the generating of the level shifter module comprises producing a description language code implementing the level shifter module.

30. The computer program product of claim 29, wherein the description language comprises at least one of: Verilog, VHDL, and a combination of Verilog and VHDL.

31. The computer program product of claim 30, wherein the description language code comprises instructions assuring that the voltage level of the crossing signal is appropriately shifted.

32. The computer program product of claim 29, wherein the inserting of the level shifter module comprises:
instantiating the description language code to form an instance of the level shifter module;
inserting the instance of the level shifter module in a voltage domain specified in the voltage constraints; and
renaming output names of the voltage domain.

33. The computer program product of claim 32, wherein the insertion of the level shifter is performed using back referencing analysis and a synthesized netlist.

34. The computer program product of claim 33, wherein the synthesized netlist is created using a synthesis engine.

35. The computer program product of claim 19, wherein the inserting of the level shifter module is preceded by verifying the correctness of the level shifter module placed in the design.

36. The computer program product of claim 19, implemented at least in part by one of a computer aided design (CAD) system, a CAD program, a netlist voltage domain analysis tool, and a register transfer level (RTL) voltage domain analysis tool.

\* \* \* \* \*